United States Patent
Püschner et al.

(10) Patent No.: US 6,472,250 B1
(45) Date of Patent: Oct. 29, 2002

(54) METHOD FOR PRODUCING A CHIP MODULE

(75) Inventors: Frank Püschner, Kelheim; Jürgen Fischer, Deuerling; Erik Heinemann, Regensburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/494,776

(22) Filed: Jan. 31, 2000

Related U.S. Application Data

(63) Continuation of application No. PCT/DE98/02046, filed on Jul. 21, 1998.

(30) Foreign Application Priority Data

Jul. 30, 1997 (DE) .......................... 197 32 915

(51) Int. Cl.[7] .................................. H01L 21/44
(52) U.S. Cl. .................. 438/112; 438/123; 438/124; 257/667
(58) Field of Search ................................ 438/112, 123; 257/667, 679; 72/379.2

(56) References Cited

U.S. PATENT DOCUMENTS 5,028,741 A * 7/1991 Sanders et al. ............ 174/52.2
5,122,860 A   6/1992 Kikuchi et al.

FOREIGN PATENT DOCUMENTS

| DE | 43 36 501 A1  | 4/1995  |
| DE | 44 43 767 A1  | 6/1996  |
| DE | 195 13 797 A1 | 10/1996 |
| EP | 0 359 632 A1  | 3/1990  |
| EP | 0 399 868 B1  | 11/1990 |
| JP | 1 106 456     | 4/1989  |

* cited by examiner

Primary Examiner—Chandra Chaudhari
Assistant Examiner—Nema Berezny
(74) Attorney, Agent, or Firm—Laurence A. Greenberg; Werner H. Stemer; Ralph E. Locher

(57) ABSTRACT

A method for producing a chip module includes punching a chip carrier to form a chip carrier fixing section and chip carrier contact sections spaced apart from the chip carrier fixing section by slots defining a given distance. The given distance is subsequently reduced to a dimension preventing a flow through of a sealing mass by a swaging operation carried out at least in a region close to the slots.

6 Claims, 1 Drawing Sheet

METHOD FOR PRODUCING A CHIP MODULE

CROSS-REFERENCE TO RELATED APPLICATION

This application is a continuation of copending International Application No. PCT/DE98/02046, filed Jul. 21, 1998, which designated the United States.

BACKGROUND OF THE INVENTION

Field of the Invention

The invention relates to a method for producing a chip module, preferably for a chip card, in which an electronic chip is disposed on a chip carrier fixing section of a punched chip carrier made of metal, terminal wires of the chip are led to chip carrier contact sections that are spaced apart from the chip carrier fixing section by slots, and the chip along with the terminal wires are encapsulated on the chip carrier by a sealing mass.

Chip cards are known in the form of credit cards or phone cards, etc. and have a chip with an integrated circuit, with which data or information, etc. can be stored. The chips are usually fixed initially onto a chip carrier before they are embedded into the chip card. To be precise, the chips are fixed on a chip carrier fixing section which is separated through the use of slots from chip carrier contact sections representing large-area terminal contacts. Once the terminal wires of the chip have been electrically connected to the corresponding chip carrier contact sections, the chip together with the terminal wires is cast in on the chip carrier. The unit including the chip carrier, the chip and a sealing mass (globe top) is referred to as a chip module.

It is already known in chip module production to use a chip carrier which is punched, in particular from a metal strip (leadframe). In that case a UV or thermally curing covering mass or a molding mass is used as the sealing mass. However, it is problematical in that case that when the sealing mass is applied, it passes through the slots in the chip carrier and travels onto the rear side of the chip carrier in an undesired manner. Although that problem can be solved in a known way by the chip carrier being inserted into a mold which seals off the rear side of the chip carrier, that method of production is complex and expensive. Furthermore, the width of the slots which can be produced by punching is normally at least approximately 0.13 mm. That width is, however, still too large to reliably prevent a low-viscosity sealing mass from passing through.

SUMMARY OF THE INVENTION

It is accordingly an object of the invention to provide a method for producing a chip module, which overcomes the hereinafore-mentioned disadvantages of the heretofore-known methods of this general type and with which a chip module can be produced in a particularly simple and low-cost way.

With the foregoing and other objects in view there is provided, in accordance with the invention, a method for producing a chip module, preferably for a chip card, which comprises punching a metal chip carrier to form a chip carrier fixing section and chip carrier contact sections spaced apart from the chip carrier fixing section by slots defining a given distance; subsequently reducing the given distance between the chip carrier fixing section and the chip carrier contact sections to a given dimension by a swaging operation carried out at least in a region close to the slots; placing an electronic chip on the chip carrier fixing section; leading terminal wires of the chip to the chip carrier contact sections; and encapsulating the chip along with the terminal wires on the chip carrier with a sealing mass prevented from flowing through the slots by the given dimension.

The swaging operation (pressing/upsetting operation) achieves a slot width which is too small for a sealing mass to be able to pass through. In accordance with another mode of the invention, after the swaging operation, the slots have a width of, for example, 4–7 μm, i.e. a width that cannot be achieved by the previous punching operation. Such a chip carrier produced by a punching and swaging operation can be produced in a very low-cost way and with very short cycle times, which significantly reduces the costs for the production of the overall chip module. Furthermore, the swaging operation creates an additional depression in the chip carrier alongside the slots, whereby the adherence of the sealing mass on the chip carrier is further improved.

In accordance with a further mode of the invention, the material thickness of the chip carrier is expediently reduced by the swaging operation to approximately 50% of the original material thickness.

With the objects of the invention in view there is also provided a method for producing a chip module, preferably for a chip card, which comprises punching a metal chip carrier having first and second opposite sides to form a chip carrier fixing section and chip carrier contact sections spaced apart from the chip carrier fixing section by slots; subsequently forming a depression into a region adjacent the slots on the first side of the chip carrier by a swaging operation defining a receiving space; placing an electronic chip on the chip carrier fixing section on the second side of the chip carrier; leading terminal wires of the chip to the chip carrier contact sections; and encapsulating the chip along with the terminal wires on the chip carrier with a sealing mass passing through the slots into the receiving space.

In this case too, the chip carrier is again produced by a combination of a punching and swaging operation, which permits a significant cost reduction and very fast production. In this case, however, it does not matter if small amounts of sealing mass get onto the rear side of the chip carrier through the slots, since the depressions which are made there form a collecting space for this sealing mass and therefore reduce the risk of the sealing mass protruding beyond the principal plane of the rear side.

Other features which are considered as characteristic for the invention are set forth in the appended claims.

Although the invention is illustrated and described herein as embodied in a method for producing a chip module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
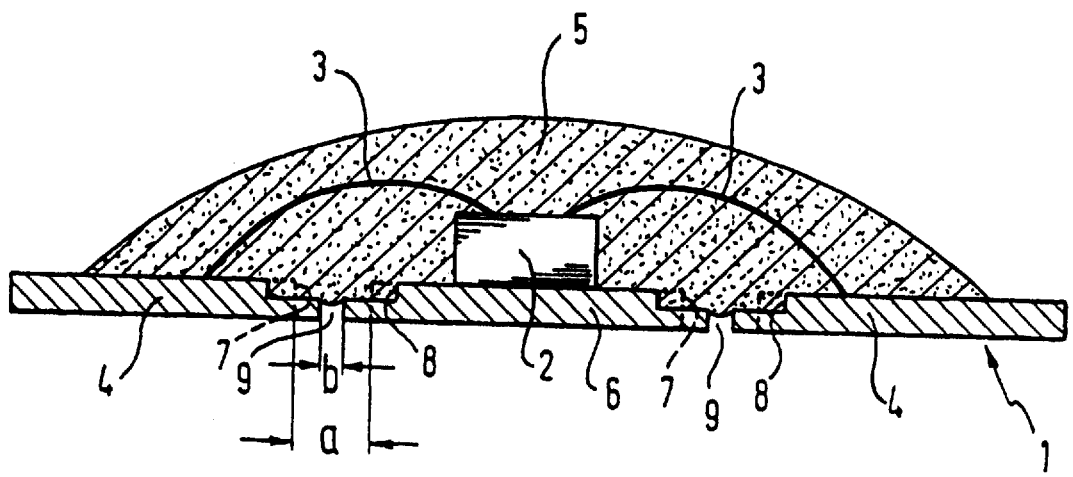
FIG. 1 is a diagrammatic, cross-sectional view of a chip module, with which a first embodiment of the method according to the invention will be explained.

Referring now to the figures of the drawings in detail and first, particularly, to FIG. 1 thereof, there is seen a chip module which essentially includes a chip carrier 1, a chip 2 that is disposed on the chip carrier 1 and has terminal wires 3 which are electrically connected to chip carrier contact sections 4, and a sealing mass 5 (globe top). The sealing mass 5 is applied to an upper side of the chip carrier 1 and completely covers the chip 2 and the terminal wires 3 and fixes the chip and the wires on the chip carrier 1.

The chip carrier 1 is formed of a thin metal strip, which is subdivided by punching into the chip carrier contact sections 4 and a chip carrier fixing section 6. The chip carrier fixing section 6 is disposed at a distance between the chip carrier contact sections 4 and carries the chip 2. Immediately after the punching operation, the chip carrier 1 has slots 7 between the chip carrier contact sections 4 and the chip carrier fixing section 6. The slots 7 are spaced apart from one another by a distance a. The shape of the chip carrier in the region of the slots 7 after the punching operation is depicted by dotted lines in FIG. 1. The distance a is, for example, between 0.15 and 0.20 mm and would consequently not be able to prevent a correspondingly low-viscosity sealing mass 5 from passing through the slots 7 to the underside of the chip carrier 1.

A swaging step is carried out from the upper side of the chip carrier 1 in the region of the slots 7 in order to prevent such passing through of the sealing mass 5 (which is applied later) in the next step. As a result, a depression 8 is impressed in the region of the slots 7. This has the effect of compressing the slots 7 to a significantly smaller dimension b of, for example, 0.05 mm. These constricted slots are provided with reference numeral 9 in FIG. 1. On one hand, the distance between the chip carrier fixing section 6 and the chip carrier contact sections 4 after the swaging operation is sufficiently large to isolate the chip carrier contact sections 4 electrically from the chip carrier fixing section 6. However, on the other hand, that distance is also sufficiently small to reliably prevent the sealing mass 5 from passing through. The width of the slots 9 is expediently matched to the viscosity of the sealing mass 5.

After the swaging operation, the chip 2 is fixed in the usual manner on the chip carrier fixing section 6, the terminal wires 3 are subsequently led to the chip carrier contact sections 4 and are fixed to the latter. As the final step for chip module production, the sealing mass 5 is applied over the entire configuration in the manner depicted in FIG. 1, so that the chip 2 and the terminal wires 3 are completely cast in and are protected and fixed within the sealing mass 5.

Figure 2:
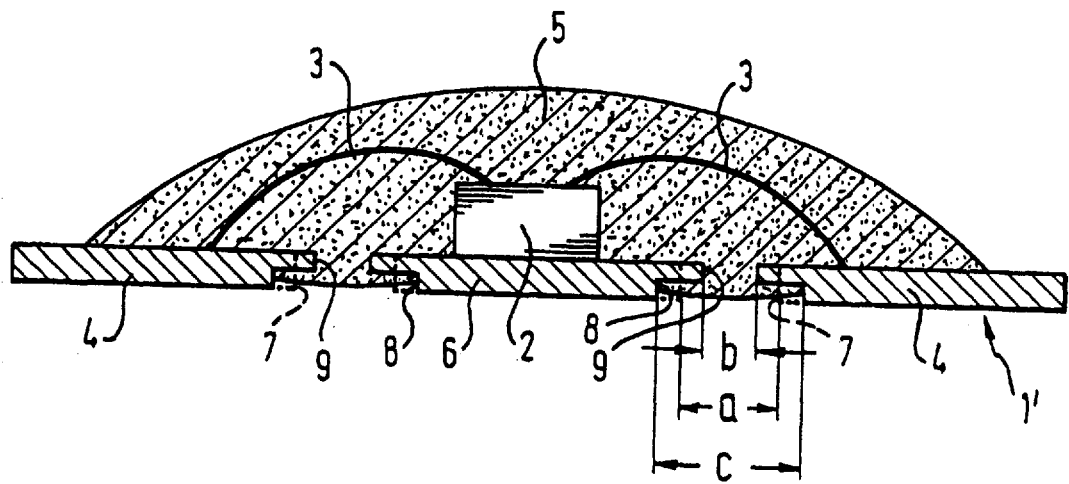
FIG. 2 is a cross-sectional view of a chip module, with which a second embodiment of the method according to the invention will be explained.

In an exemplary embodiment of an alternative chip module represented in FIG. 2, first of all a chip carrier 1' is again produced through the use of a punching operation. Slots 7 between the chip carrier fixing section 6 and the chip carrier contact sections 4 are produced with the width a (see the dotted lines).

In contrast to the exemplary embodiment of FIG. 1, in the exemplary embodiment of FIG. 2 depressions 8, which have a width c, are made from the rear or first side of the chip carrier 1' in the region of the slots 7, rather than from the upper or second side, through the use of a swaging operation. In the illustrated exemplary embodiment, the depth of the depressions 8 is approximately 50% of the thickness of the chip carrier 1'. However, due to the swaging operation, the slots 7 are again constricted to the dimension b, which in this case may be large enough to permit sealing masses 5 applied later to pass through the constricted slots 9 to the rear side of the chip carrier 1'. In this case, the depressions 8 act as a receiving space for this passing-through part of the sealing mass 5, so that the risk of the sealing mass 5 protruding beyond the rear side of the chip carrier 1' is reduced significantly.

A quickly curing covering mass, for example a UV or thermally curing covering mass, is expediently used as the sealing mass 5.

Both of the embodiments shown in FIGS. 1 and 2 offer the advantage of allowing the chip carrier 1, 1' to be produced in a very quick and low-cost manner by the combination of a punching and a swaging step.

We claim:

1. A method for producing a chip module, which comprises:

punching a metal chip carrier to form a chip carrier fixing section and chip carrier contact sections spaced apart from the chip carrier fixing section by slots defining a given distance;

subsequently reducing the given distance between the chip carrier fixing section and the chip carrier contact sections to a given dimension by a swaging operation carried out at least in a region close to the slots;

placing an electronic chip on the chip carrier fixing section;

leading terminal wires of the chip to the chip carrier contact sections; and encapsulating the chip along with the terminal wires on the chip carrier with a sealing mass prevented from flowing through the slots by the given dimension.

2. The method according to claim 1, which comprises reducing a material thickness of the chip carrier with the swaging operation to 30 to 70% of an original material thickness.

3. The method according to claim 1, which comprises reducing a material thickness of the chip carrier with the swaging operation to 50% of an original material thickness.

4. The method according to claim 1, which comprises the slots are constricted by the swaging operation to a width of 4–7 $\mu$m.

5. The method according to claim 1, which comprises the slots are constricted by the swaging operation to a width of 5 $\mu$m.

6. A method for producing a chip module, which comprises:

punching a metal chip carrier having first and second opposite sides to form a chip carrier fixing section and chip carrier contact sections spaced apart from the chip carrier fixing section by slots;

subsequently forming a depression into a region adjacent the slots on the first side of the chip carrier by a swaging operation defining a receiving space;

placing an electronic chip on the chip carrier fixing section on the second side of the chip carrier;

leading terminal wires of the chip to the chip carrier contact sections; and encapsulating the chip along with the terminal wires on the chip carrier with a sealing mass passing through the slots into the receiving space.

* * * * *